United States Patent [19]

Patel

[11] Patent Number: 4,706,250
[45] Date of Patent: Nov. 10, 1987

[54] METHOD AND APPARATUS FOR CORRECTING MULTIBYTE ERRORS HAVING IMPROVED TWO-LEVEL CODE STRUCTURE

[75] Inventor: Arvind M. Patel, San Jose, Calif.

[73] Assignee: International Business Machines Corporation, Armonk, N.Y.

[21] Appl. No.: 781,449

[22] Filed: Sep. 27, 1985

[51] Int. Cl.$^4$ .............................................. G06F 11/10
[52] U.S. Cl. ......................................... 371/39; 371/38
[58] Field of Search ........................ 371/37, 38, 39, 40

[56] References Cited

U.S. PATENT DOCUMENTS

| | | | |
|---|---|---|---|
| 4,447,902 | 5/1984 | Wilkinson | 371/39 |
| 4,494,234 | 1/1985 | Patel | 371/38 |
| 4,504,948 | 3/1985 | Patel | 371/38 |
| 4,525,838 | 6/1985 | Patel | 371/37 |
| 4,559,568 | 12/1985 | Watanabe et al. | 371/39 X |
| 4,562,578 | 12/1985 | Odaka et al. | 371/40 |
| 4,630,272 | 12/1986 | Fukami et al. | 371/37 |

Primary Examiner—Charles E. Atkinson
Attorney, Agent, or Firm—F. David LaRiviere; Simon K. Lee

[57] ABSTRACT

A system for correcting errors in data read from a direct access storage device employs an extendable, two-level coding scheme having n subblocks in a relatively long variable-length block of data, each subblock having up to m bytes of data. At the subblock level, decoding capability provides correction of up to $t_1$ errors and detection of up to $t_1+c$ errors in each subblock, while the block-level decoding capability provides correction of up to $t_2$ errors in any one of the subblocks. The combined capability of the system corrects any combination of $(t_1+x)$ errors in one subblock, and up to $t_1$ errors in any or all of the other subblocks in the block, where x is a non-negative integer such that $(t_1+x) \leq t_2$ and $x < c$. The combined capability of the system also provides correction of any combination of $(t_1+x)$ errors in one subblock and up to $(t_1+C-x)$ errors in any or all of the other subblocks in the block, where x is an integer such that $(t_1+x) \leq t_2$ and $x > c$.

23 Claims, 12 Drawing Figures

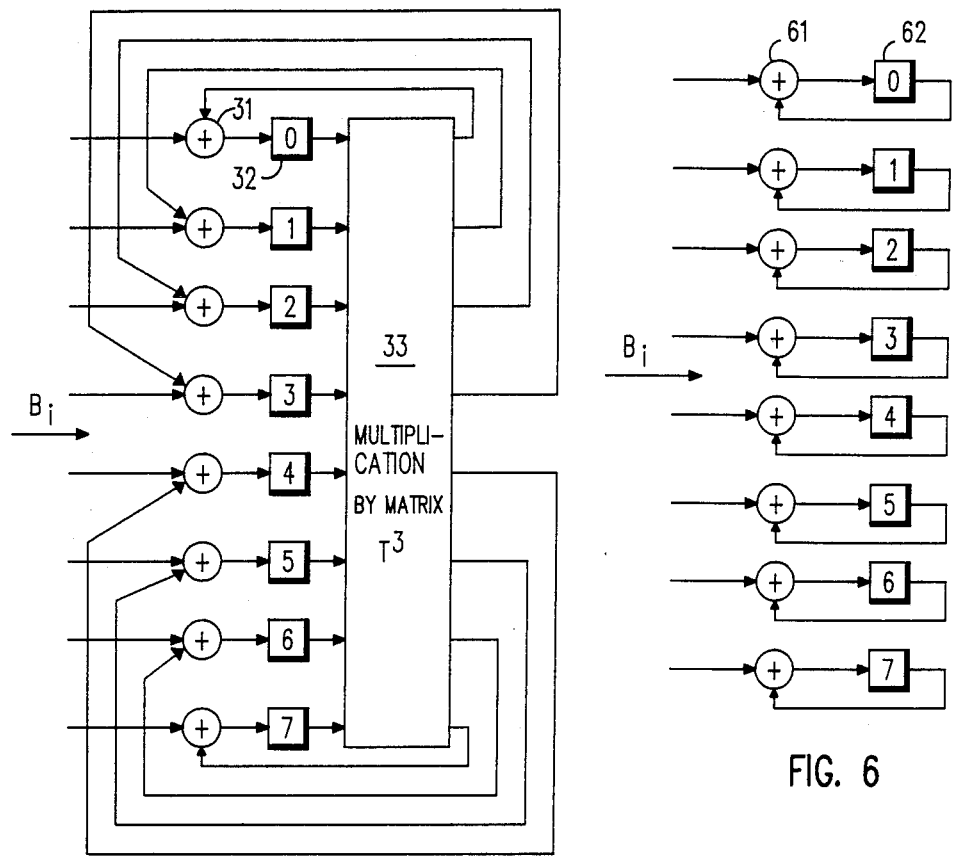
FIG. 4
FIG. 6
$$T^3 = \begin{pmatrix} 0 & 0 & 0 & 0 & 0 & 1 & 1 & 1 \\ 0 & 0 & 0 & 0 & 0 & 0 & 1 & 1 \\ 0 & 0 & 0 & 0 & 0 & 0 & 0 & 1 \\ 1 & 0 & 0 & 0 & 1 & 1 & 1 & 1 \\ 0 & 1 & 0 & 0 & 0 & 1 & 1 & 1 \\ 0 & 0 & 1 & 0 & 0 & 1 & 1 & 0 \\ 0 & 0 & 0 & 1 & 0 & 0 & 1 & 1 \\ 0 & 0 & 0 & 0 & 1 & 1 & 1 & 0 \end{pmatrix} \begin{matrix} 51 \\ 52 \\ 53 \\ 54 \\ 55 \\ 56 \\ 57 \\ 58 \end{matrix}$$
COL. 0 1 2 3 4 5 6 7
FIG. 5A
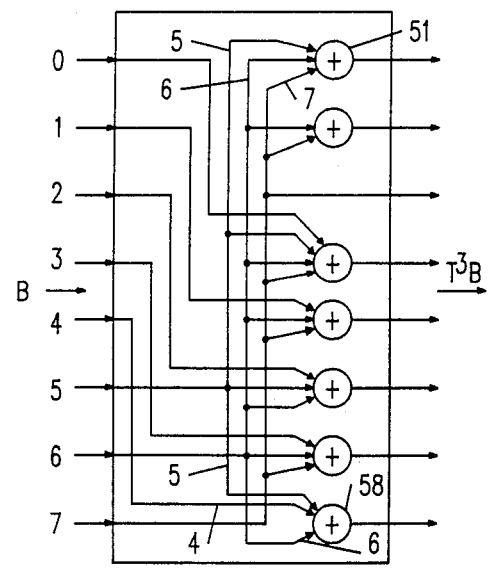
FIG. 5B $$T^{-1} = \begin{pmatrix} 0 & 1 & 0 & 0 & 0 & 0 & 0 & 0 \\ 0 & 0 & 1 & 0 & 0 & 0 & 0 & 0 \\ 1 & 0 & 0 & 1 & 0 & 0 & 0 & 0 \\ 0 & 0 & 0 & 0 & 1 & 0 & 0 & 0 \\ 1 & 0 & 0 & 0 & 0 & 1 & 0 & 0 \\ 0 & 0 & 0 & 0 & 0 & 0 & 1 & 0 \\ 1 & 0 & 0 & 0 & 0 & 0 & 0 & 1 \\ 1 & 0 & 0 & 0 & 0 & 0 & 0 & 0 \end{pmatrix}_{90A}$$

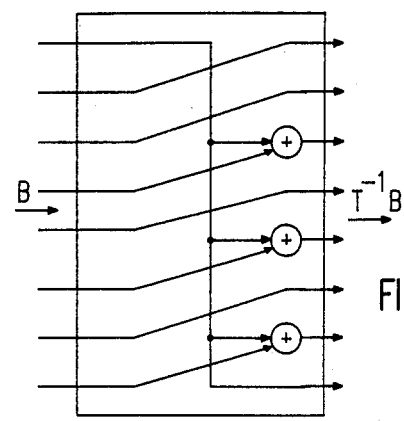

FIG. 9A $$T^{-2} = \begin{pmatrix} 0 & 0 & 1 & 0 & 0 & 0 & 0 & 0 \\ 1 & 0 & 0 & 1 & 0 & 0 & 0 & 0 \\ 0 & 1 & 0 & 0 & 1 & 0 & 0 & 0 \\ 1 & 0 & 0 & 0 & 0 & 1 & 0 & 0 \\ 0 & 1 & 0 & 0 & 0 & 0 & 1 & 0 \\ 1 & 0 & 0 & 0 & 0 & 0 & 0 & 1 \\ 1 & 1 & 0 & 0 & 0 & 0 & 0 & 0 \\ 0 & 1 & 0 & 0 & 0 & 0 & 0 & 0 \end{pmatrix}_{90B}$$

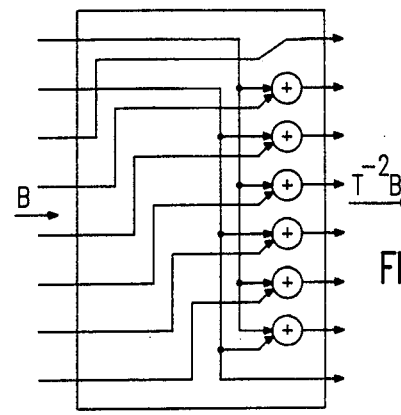

FIG. 9B $$T^{-3} = \begin{pmatrix} 1 & 0 & 0 & 1 & 0 & 0 & 0 & 0 \\ 0 & 1 & 0 & 0 & 1 & 0 & 0 & 0 \\ 1 & 0 & 1 & 0 & 0 & 1 & 0 & 0 \\ 0 & 1 & 0 & 0 & 0 & 0 & 1 & 0 \\ 1 & 0 & 1 & 0 & 0 & 0 & 0 & 1 \\ 1 & 1 & 0 & 0 & 0 & 0 & 0 & 0 \\ 0 & 1 & 1 & 0 & 0 & 0 & 0 & 0 \\ 0 & 0 & 1 & 0 & 0 & 0 & 0 & 0 \end{pmatrix}_{90C}$$

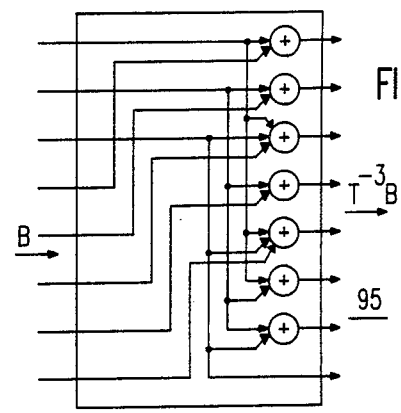

FIG. 9C

METHOD AND APPARATUS FOR CORRECTING MULTIBYTE ERRORS HAVING IMPROVED TWO-LEVEL CODE STRUCTURE

FIELD OF INVENTION

This invention relates in general to a system and method for correcting multiple byte errors in a codeword and, in particular, to a method and system for correcting multibyte errors in a relatively long block of data read from a disk file.

BACKGROUND OF THE INVENTION

The prior art describes various systems and methods for correcting errors. U.S. Pat. No. 4,525,838, entitled "Multibyte Error Correcting System Involving a Two-Level Code Structure" by the inventor hereof and assigned to the assignee hereof is pertinent, provides other relevant references, and is hereby incorporated by reference as if fully set forth herein.

Present day disk file manufacturers employ a number of different approaches to minimizing the number of errors that may occur during the readback process. Most disk file media undergo a thorough surface analysis test to identify defective areas before the disk is incorporated into the drive. Those disks having defects above a certain predetermined criteria are rejected.

In addition, subsystems are provided in many disk file devices which, based on defect data stored on a disk, cause the drive to avoid a bad track, a bad sector, or a defective area of a disk track during operation. Bad areas of the media are simply skipped during the storage of data on the track. Other subsystems cause the device to reread the data when an error is detected. The rereading operation is performed under slightly different operating conditions each time, such as offsetting the transducer from the center of the track or increasing the gain of the read amplifier until, hopefully, the error is corrected during the rereading process.

Since addition of an error-correcting subsystem adversely impacts overall system performance, it is important to minimize the number of errors that have to be corrected and the time it takes to correct them. In addition, the more errors which must be corrected, the more otherwise usable storage capacity rs wasted.

Typically, subsystems which correct only single errors are used in current disk files. A single error, by definition, may include a burst-type error in which a group of contiguous bit positions are affected. However, two separate burst errors, or even widely spaced single bit errors, cannot be corrected by such single error-correcting subsystems.

It is well known that all the different error patterns which occur in one byte of a multibyte codeword are correctable using a reasonable amount of redundancy. It has also been recognized that by interleaving codewords, a burst error which extends longer than one byte may be corrected.

It is also known that a multibyte, error-correcting system may be provided in accordance with the teaching of U.S. Pat. No. 4,494,234 entitled "On-the-Fly Multibyte Error Correcting System", by the inventor hereof and assigned to the assignee of the present invention.

One of the main reasons multibyte error-correcting subsystems have not been readily adopted for use in disk files is the constraints imposed on block size or codeword by various error correcting codes in use today. A codeword is typically limited to $2^b$ bytes where b is the number of bit positions in the byte configuration adopted for the system. Where the byte consists of eight bits, which is substantially the present standard in the data processing industry, the codeword is usually limited to 255 bytes. It is further recognized that for each byte error to be corrected in a codeword of 255 bytes, two check bytes must be associated with the codeword for each byte error. Thus, if the error correcting code (ECC) is designed to correct five byte errors in each codeword, then ten check byte positions must be allocated out of the 255 byte positions. Obviously, where redundancy becomes so high, the overall useful storage capacity of the disk file is severely restrrcted.

Besides adversely affecting useful storage capacity, the relatively small block size also imposes many undesirable constraints in the design of the data format that is used on the track. Conventional coding techniques, such as multiple error correcting Reed-Solomon or BCH codes discussed in the prior art, while very efficient in terms of mathematical redundancy, impose algebraic constraints on the size of the codeword for a given choice of byte size. Thus, in a practical application of 8-bit bytes in the presence of high error rates, the redundancy is often still unacceptable.

A two-level, multibyte error-correcting subsystem for correcting errors occurring in more than one byte is taught in U.S. Pat. No. 4,525,838 by the inventor hereof and assigned to the assignee of the present invention. However, for that subsystem, if the number of errors occurring in any one subblock exceeds the error-correction capability at the subblock level, the codeword may be miscorrected at the subblock-level. When the miscorrection is detected at the block-level, the miscorrected subblock is restored to its original condition before such errors are corrected at the block-level. Moreover, the subsystem of that patent will not make corrections as described unless all other subblocks are error-free or the number of errors occurring in all other subblocks are correspondingly reduced to below the subblock-level error-correction capability by the same amount as the number of excess errors in one subblock.

SUMMARY OF THE INVENTION

The multibyte error-correcting subsystem according to the present invention employs a two-level code structure having improved capability and simplified procedure. The structure provides at least four major advantages. First, the constraint on the size of the codeword rs eliminated. Second, the decoding strategy permits "on-the-fly" correction of multibyte errors at the sub-block-level and additional reserve error correction capability at the block-level. Third, when the number of errors occurring in one subblock exceeds the subblock-level error correcting capability by a selectable number of additional errors, c, the codeword is corrected at the block-level, without first being miscorrected at the subblock-level. Finally, second-level (i.e., block-level) correction of excessive errors in one subblock does not require corresponding reduction in the number of correctable errors in all other subblocks, so long as the excessive errors do not exceed c.

In addition to the above-listed advantages of the present invention, if the number of additional errors in one subblock exceed c, the error-correcting subsystem of the present invention is still capable of correcting those errors. Such additional excessive errors may cause codeword miscorrection at the first level and are detected and corrected at the second level in the same manner as described in U.S. Pat. No. 4,525,838.

In the two-level coding structure of the present invention, the data is formatted on a disk track into n subblocks within a block, each subblock comprising a prrmary codeword with m data bytes and $r_1$ check bytes. Of course, a subblock may also comprise two or more interleaved primary codewords of the same byte-composition of data and check bytes.

At the first level (i.e., subblock-level), the coding structure is designed to correct up to $t_1$ errors and to detect up to $t_1+c$ errors in each subblock of the primary codeword. At the second level (i.e., block level), the structure will correct up to $t_2$ errors in any one of the subblocks.

The block-level check bytes are shared by all the subblocks in a block. If there are any errors in block-level check bytes, then the second level error correction capability, $t_2$, is reduced by an amount corresponding to the number of block-level check-byte errors.

At the first level, the subsystem of the present invention provides on-the-fly correction of $t_1$ errors in each subblock and identifies a subblock having more than $t_1$ errors. Correction of a subblock having more than $t_1$ errors is deferred to the end of the record (i.e., block-level), and can be performed on-the-fly or by any other known software or hardware method.

The present invention enhances error correcting capability of previously known two-level multibyte correcting systems by adaptive utilization of check bytes at both levels. The method and apparatus of this invention can concentrate the two-level error-correcting capability on one subblock having more than $t_1$ errors while at the same time providing capability for correcting $t_1$ errors in any or all other subblocks in a block consisting of several subblocks.

DESCRIPTION OF THE DRAWINGS

FIG. 4 is a block diagram of the logic employed for generating the third subblock level check byte.

FIG. 5A is the matrix $T^3$ employed in the logic operations of FIGS. 3 and 4.

FIG. 5B is a block diagram of the logic of the matrix multiplier of FIG. 5A.

FIG. 6 is a block diagram of the specific logic employed in the ECC system of the present invention for generating one block check byte.

FIG. 9A is a $T^{-1}$ matrix multiplier employed in the decoder of FIG. 8.

FIG. 9B is a $T^{-2}$ matrix multiplier employed in the decoder of FIG. 8.

FIG. 9C is a $T^{-3}$ matrix multiplier employed in the decoder of FIG. 8.

DESCRIPTION OF THE PREFERRED EMBODIMENT

Figures 1, 2:
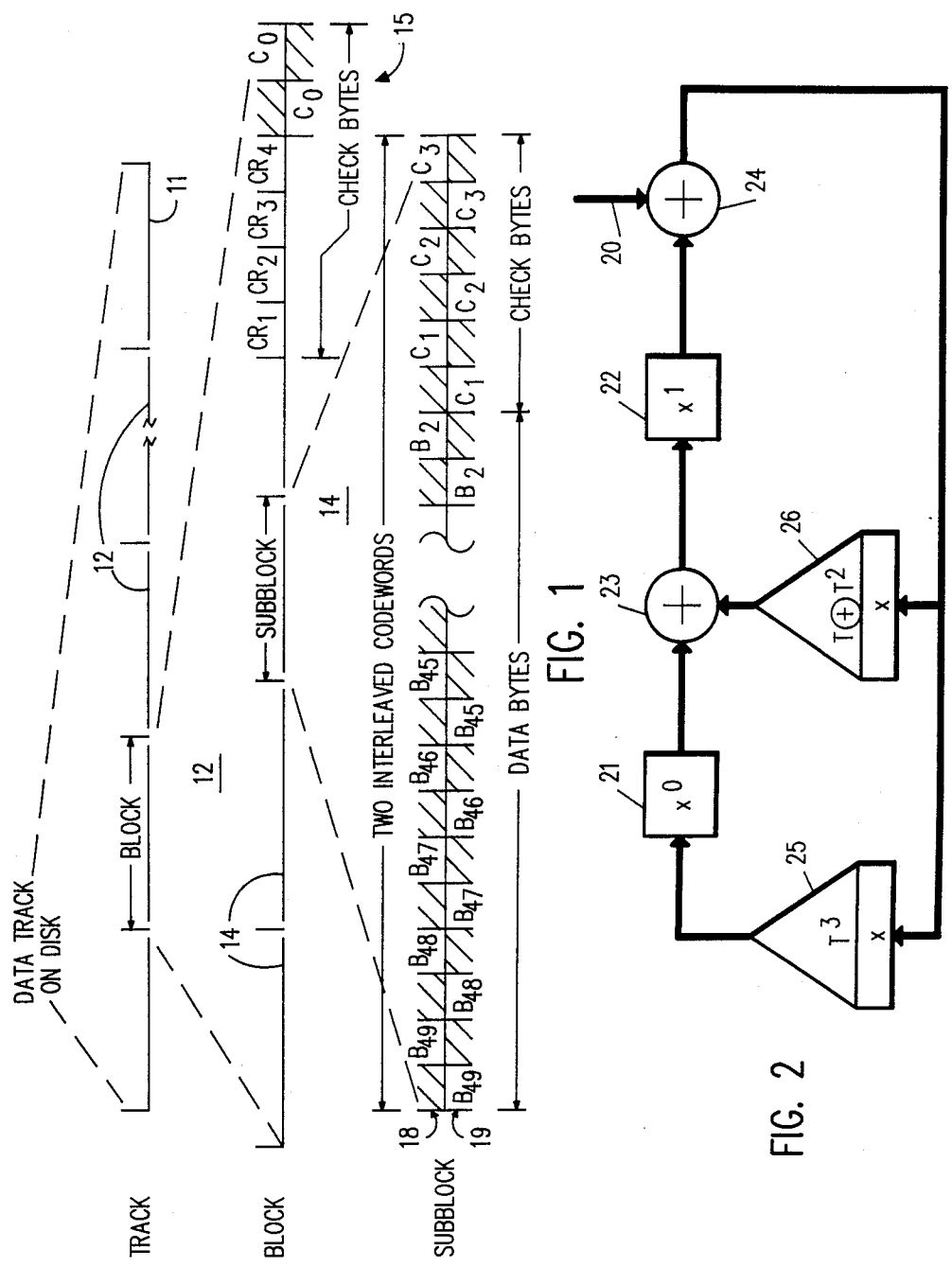
FIG. 1 is a diagrammatic illustration showing the data format of a two-level coding structure for a disk track constructed according to the principles of the present invention.
FIG. 2 is a block diagram of the feedback shift register for producing two of three subblock level check bytes for the error-correcting system of the present invention.

In FIG. 1 data is recorded along a disk track in a two-level code constructed according to the principles of the present invention. The error correction capability of this embodiment of the present invention is designed to correct up to two errors in one of the subblocks and up to one error in any or all remaining subblocks in the block. An error is defined as any pattern of eight bits in one byte position of the block which is not the correct pattern. The invention is applicable to systems for correcting any number of errors in various combinations in the subblocks of the block. This general case is described elsewhere in this specification.

As shown in FIG. 1, data recorded along track 11 is formatted into a plurality of fixed or variable length blocks 12, each of which are divided into a predetermined plurality of subblocks 14. A block check byte area 15 is associated with each block which, as shown and described in more detail elsewhere in this application, includes four check byte positions for data integrity checking and two check byte positions for second-level error correction.

In the configuration of FIG. 1, a codeword comprises 48 data byte positions and three check byte positions. Each subblock has two interleaved codewords. A block comprises: n subblocks (n=4), each having 96 data byte positions and three pairs of subblock check bytes, $C_1$, $C_2$ and $C_3$; four check bytes, $CR_1$-$CR_4$, for data integrity checking; and two check bytes, $C_0$, for second-level correction.

Data integrity check bytes, $CR_1$-$CR_4$, appended to the end of the block are CRC check bytes which provide data integrity check after ECC correction. These check bytes, how they are determined and produced, form no part of the present invention.

The preferred embodiment of the present invention is based on codes for symbols in Galois Fields $(2^8)$, or GF $(2^8)$. The primary codeword in a subblock comprises m data bytes (m=48) designated $B_2, B_3 \ldots B_{m+1}$, and three check bytes designated $C_1$, $C_2$ and $C_3$. Check bytes $C_1$ and $C_2$ identically correspond to $B_1$ and $B_0$ and satisfy the following two modulo-2 matrix equations:

$$B_0 \oplus TB_1 \oplus T^2B_2 \oplus \ldots \oplus T^{m+1}B_{m+1} = 0 \quad (1)$$

$$B_0 \oplus T^2B_1 \oplus T^4B_2 \oplus \ldots \oplus T^{2(m+1)}B_{m+1} = 0 \quad (2)$$

In equations (1) and (2), the $\oplus$ represents a modulo-2 summation operation, $B_i$ is an 8-bit byte as a column vector, i is a byte position in the codeword and has a value from 0 to m+1, where m+1 is equal to or less than 254 or $(2^8 - 2)$. T is a companion matrix of a primitive polynomial of degree 8. The symbol $T^i$ represents T multiplied by itself i times. It is assumed that the following T matrix is embodied in the preferred embodiment:

$$T = \begin{bmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 1 \\ 0 & 0 & 0 & 1 & 0 & 0 & 0 & 0 \\ 0 & 0 & 0 & 0 & 1 & 0 & 0 & 1 \\ 0 & 0 & 0 & 0 & 0 & 1 & 0 & 0 \\ 0 & 0 & 0 & 0 & 0 & 0 & 1 & 1 \end{bmatrix} \quad (3)$$

The code given by equations (1) and (2) is single-symbol-correcting Reed-Solomon or BCH code readily known from the prior art. The 8-bit column vectors correspond to elements of GF ($2^8$), and multiplication by matrix $T^i$ corresponds to the multiplication by the Galois field element $\alpha^i$ where $\alpha$ is a primitive element represented by the first column of the matrix T.

Figure 3:
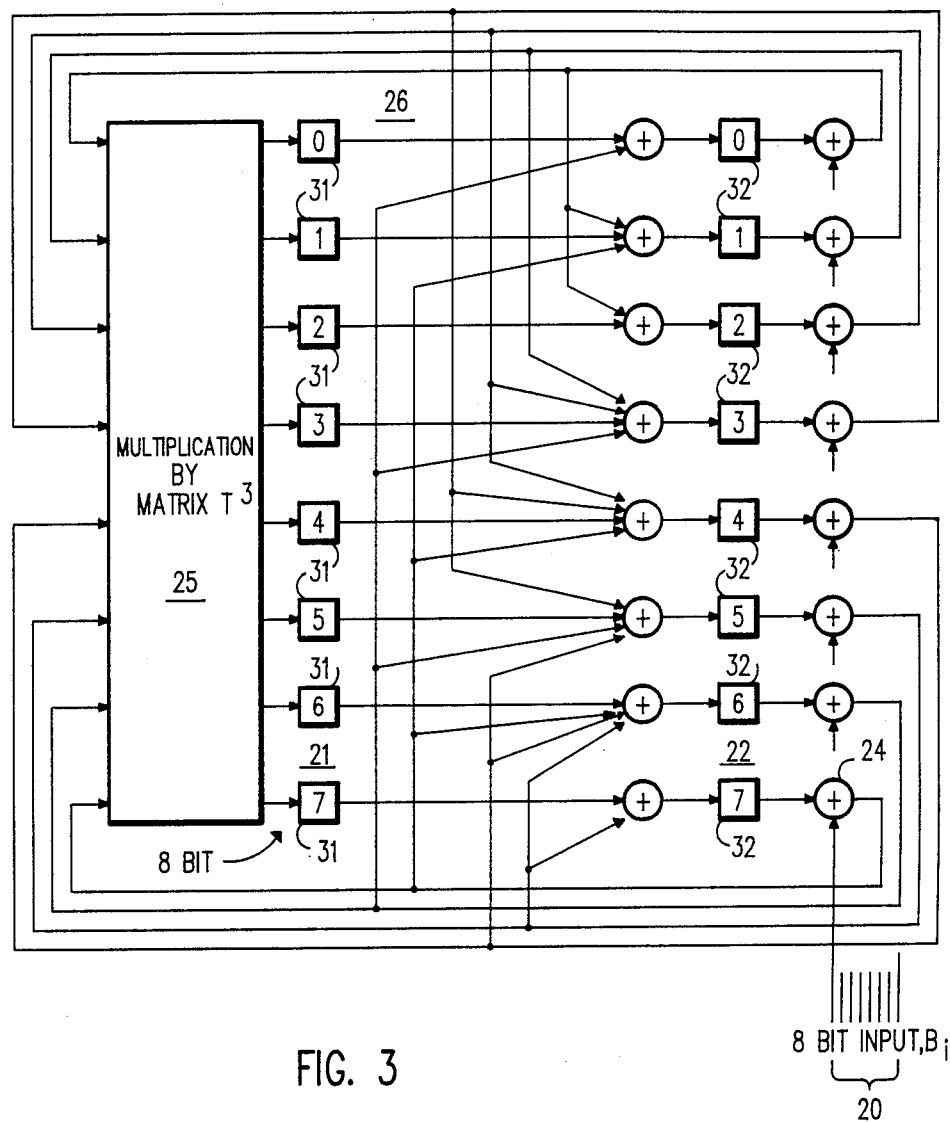
FIG. 3 is a block diagram, in greater detail, of the logic for the feedback shift registers shown schematically in FIG. 2.

The encoder for generating check bytes $C_1$ and $C_2$ for each word in a subblock is shown in FIGS. 2 and 3. The encoder functions to perform modulo g (x)2 operations where g (x) is a polynomial with roots $\alpha$ and $\alpha^2$. The specific generator polynomial is:

$$g(x) = (T+x)(T^2+x) = T^3 x^0 + (T+T^2) x^1 + x^2.$$

Check bytes $C_1$ and $C_2$, which correspond to $B_0$ and $B_1$, respectively, for one codeword are developed by supplying data bytes $B_{m+1}$ through $B_2$ to input 20. Block 21 and block 22 function to store an 8-bit field element. Blocks 23 and 24 function to add two 8-bit field elements modulo 2, while blocks 25 and 26 function as matrix multipliers to multiply an 8-bit field element by a specific matrix. Initially, blocks 21 and 22 are set to zero and the data bytes are clocked into the encoder at input 20. At the end of the operation, blocks 21 and 22 of the encoder contain check bytes $C_1$ and $C_2$, respectively.

Check byte $C_3$ is given by the modulo 2 matrix equation:

$$C_3 = \sum_{i=0}^{m+1} T^{3i} B_i \quad (4)$$

The computation of $C_3$, unlike the computations of $C_1$ and $C_2$, is performed separately by means of a shift register and matrix multiplier as shown in FIG. 4. Initially, the shift register is set to all zeroes and the ordered sequence of subblock bytes, starting with $B_{m+1}$ through $B_0$, is entered into the register in m+2 successive shifts. At the end of this operation, the contents of register 32 corresponds to the value of $C_3$. Element 31 of FIG. 3 is an exclusive-OR circuit, and element 32 is one stage of a shift register. Element 33 is a matrix multiplier of the type shown in FIG. 5.

The details of the matrix multiplier for $T^3$, represented by block 25 in FIGS. 2 and 3 and block 33 of FIG. 4 are shown in FIGS. 5A and 5B. Selected bit positions of 8-bit vector, B, are combined modulo 2 in blocks 51 through 58. The bit positions selected for inputs to blocks 51 and 58 are determined from matrix $T^3$ as shown in FIG. 5A. The top row determines the input for block 51, while the bottom row determines the input for block 58. A binary "1" digit in a column signifies an input from the corresponding bit position of the input vector B. Hence, block 51 receives input from bit positions 5, 6 and 7, while block 58 receives input from bit positions 4, 5 and 6, corresponding respectively to the columns containing ones in the matrix $T^3$. The inputs to other blocks are arranged in like manner.

As aforementioned, a block according to the present invention, comprises any number of subblocks, n, with an additional check byte, $C_0$, appended at the end. $C_0$ is computed for each subblock and accumulated modulo 2 over all subblocks, as specified by the following modulo-2 matrix equation:

$$C_0 = \sum_{subbk=1}^{n} \left( \sum_{i=0}^{m+1} B_i \right)_{subbk} \quad (5)$$

$C_0$ encoding is performed by a separate shift register encoder, as schematically shown in FIG. 6. The encoder for $C_0$ is functionally equivalent to a parity generator for each bit position of the input vectors. Element 61 represents an exclusive-OR circuit, while element 62 represents one stage of a register.

Initially, shift register 62 is set to zero, and bytes $B_i$ of the first subblock are supplied to each encoder starting with $B_{m+1}$ through $B_0$ in (m+2) successive shifts. At the end of the shift sequence, the contents of register 62 corresponds to $C_0$ for the first subblock. $C_0$ for each successive subblock of the block is accumulated modulo 2 over all of the subblocks in a suitable buffer.

If there is only one subblock, the four check bytes $C_0$, $C_1$, $C_2$ and $C_3$ corresponding to equations (1), (2), (4) and (5) comprise a code that is obtained by extending a two-symbol correcting BCH code such as that described by J. K. Wolf in an article in the BELL SYSTEM TECHNICAL JOURNAL, No. 48, pages 2408 through 2424, published in 1969 and entitled "Adding Two Information Symbols to Certain Non-binary BCH Codes and Some Applications". In the present embodiment, the block-level codeword can be viewed as a modulo 2 super-position of the four subblock codewords. Therefore, a two-symbol error in such a superpositioned codeword is correctable.

In the embodiment shown, the first three of the four block check bytes are developed by merely accumulating subblock check bytes $C_1$, $C_2$, $C_3$ which need not be recorded at the block level. The four block check bytes required to correct two one-byte errors in one subblock may be obtained independent of the subblock check bytes $C_1$, $C_2$ and $C_3$. The four matrices $T^a$, $T^{a+1}$, $T^{a+2}$, $T^{a+3}$ which are selected for generating the four block check bytes, however, must be adjacent powers a, a+1, a+2, and a+3 of the matrix T in the GF($2^8$) field. The preferred embodiment of the present invention saves redundancy and hardware by making use of the accumulated subblock check bytes $C_1$, $C_2$ and $C_3$ for each word of the block.

Figure 7:
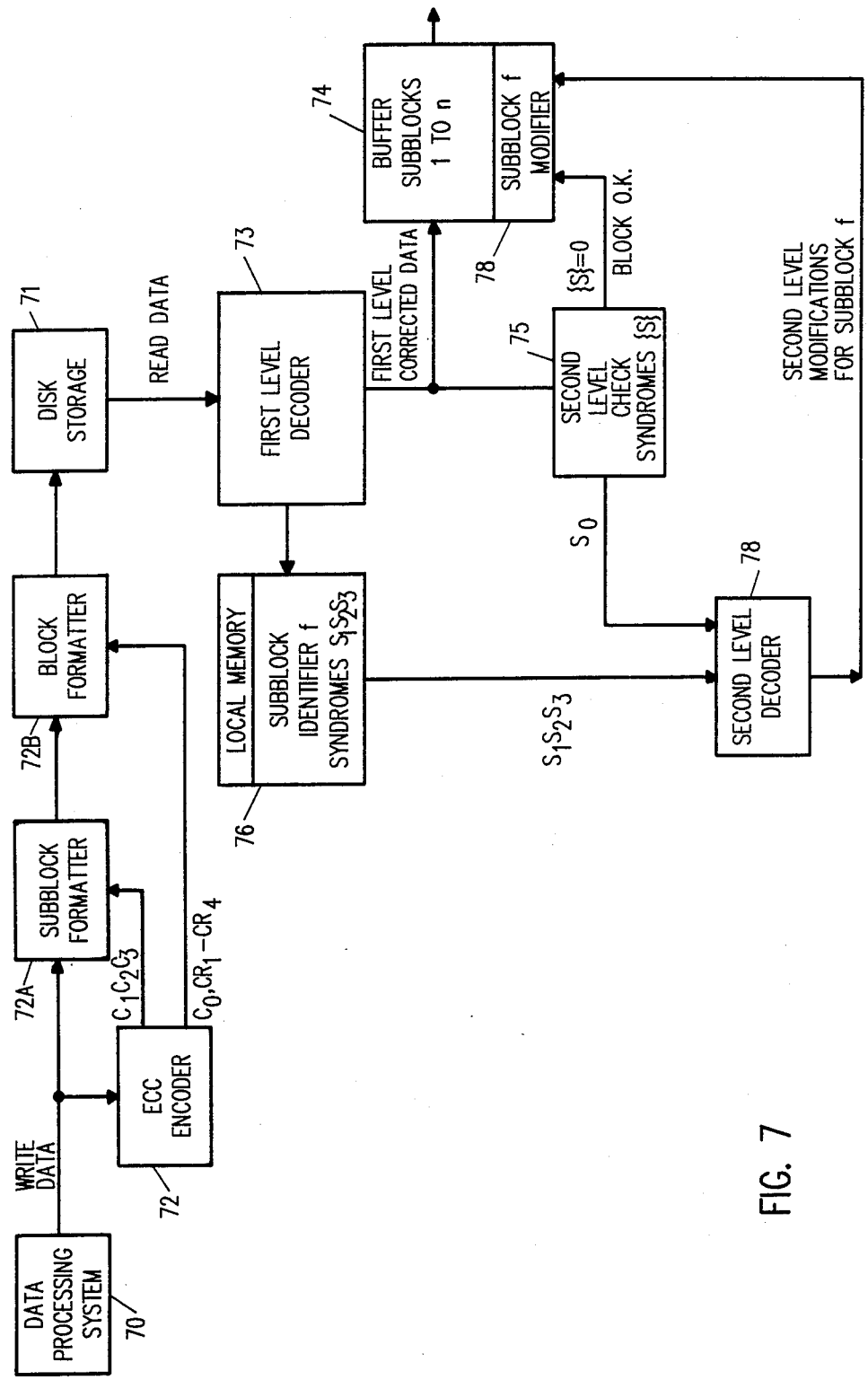
FIG. 7 is a block diagram of the first and second level portions of the ECC system for correcting single errors in the subblocks by processing subblock syndromes and for correcting two errors in a subblock by processing subblock and block syndromes according to the present invention.

Referring now to FIG. 7, data from data processing system 70 is sent to disk file 71 for storage on a track which is formatted as shown in FIG. 1. In the transfer of this data, three sets of check bytes $C_1$, $C_2$ and $C_3$ are developed for each subblock by ECC encoder 72 in accordance with the previous description. Similarly, block check byte $C_0$ is also developed by encoder 72. The subblock formatter 72A appends check bytes $C_1$, $C_2$ and $C_3$ to each corresponding subblock. Similarly, block formatter 72B appends block check byte $C_0$ (as well as data integrity check bytes, $CR_1$-$CR_4$) at the end of the block. The formatted data is then recorded on disk storage 71.

In the readback process, the read data are checked by the coding equations (1), (2), (4) and (5) in order to develop the syndromes of error in the conventional manner. In particular, the subblock check bytes $C_1$, $C_2$ and $C_3$ are associated with syndromes $S_1$, $S_2$ and $S_3$, while block-level check byte $C_0$, is associated with the $S_0$ syndrome byte.

It should be understood that the subscript numbers assigned to the syndromes, that is $S_0$, $S_1$, etc., are related to the particular T matrix employed to generate the respective check characters. Specifically, $S_0$, which is developed from $C_0$, corresponds to a conventional parity check byte, since each bit position of the word is checked, as shown in FIG. 6. $S_3$, on the other hand, is developed from $C_3$ which is generated in accordance with the logic shown in FIG. 4 that involves multiplying the input byte by a matrix $T^3$. Syndromes $S_1$ and $S_2$, which correspond to check bytes $C_1$ and $C_2$, respectively, are similarly generated, using logic which involves matrices $T^1$ and $T^2$, respectively. Such logic for syndrome generation is well known.

Referring again to FIG. 7 for the readback process, block 73 represents the first level ECC function of correcting a single byte error in each of the two interleaved words. A block of data is read from the file and stored in block buffer 74 by subblocks. If syndromes $S_1$, $S_2$ and $S_3$ for each word of the subblock are all zeros, then no error has occurred. If all subblocks are error-free, then block 75, which generates second level syndromes (and also data integrity check bytes CR1–CR4), will also indicate an error-free block and the block may be sent to data processing system 70.

The non-zero value of syndromes $S_1$, $S_2$ or $S_3$ which correspond to decoded check bytes $C_1$, $C_2$ or $C_3$, indicates presence of error at the subblock level. If the subblock has only one byte in error at position $i=x$, where $0 \leq i \leq m+1$, the read bytes $\widetilde{B}_i$ can be written as $$\widetilde{B}_i = \begin{cases} B_i \oplus E_x & \text{at } i = x \\ B_i & \text{at } i \neq x \end{cases}$$

where $E_x$ is an 8-bit error pattern. Then the computed syndromes corresponding to the coding equation (1), (2) and (4) reduce to $$S_1 = T^x E_x \quad (6)$$

$$S_2 = T^{2x} E_x \quad (7)$$

$$S_3 = T^{3x} E_x, \quad (8)$$

If the one-byte error is in check byte $C_3$, then the syndromes reduce to $$S_1 = S_2 = 0$$

and $S_3 = T^{3x} E_x$.

Thus, the decoding equation is given by $$\left. \begin{array}{l} E_x = T^{-x}S_1 = T^{-2x}S_2 = T^{-3x}S_3 \text{ if } B_x \text{ is in error} \\ \text{and } 0 = \quad S_1 = \quad S_2 \neq \quad S_3 \text{ if } C_3 \text{ is in error} \end{array} \right\} \quad (9)$$

Figure 8:
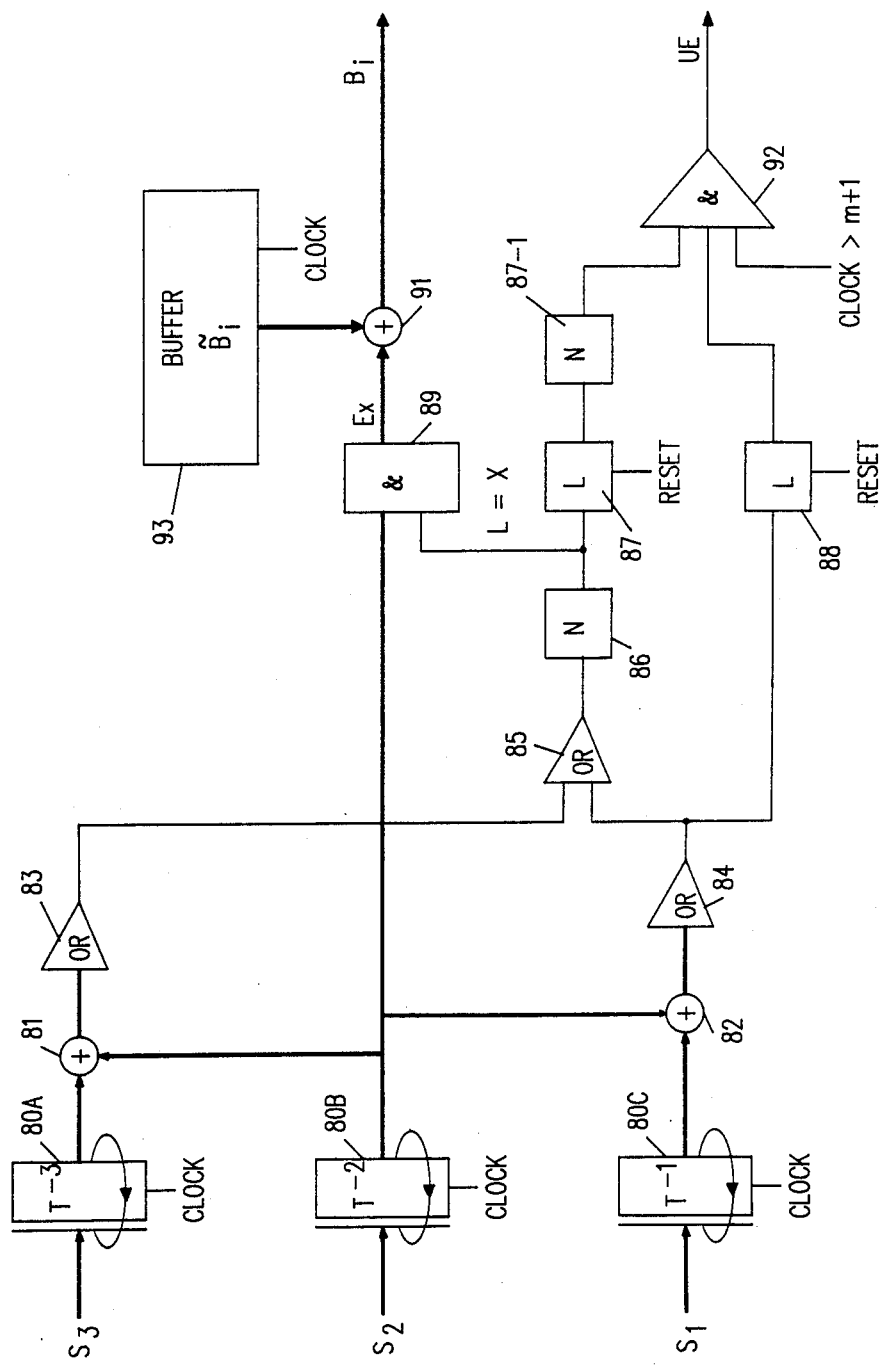
FIG. 8 is a block diagram of a subblock-level decoder according to the principles of the present invention.

First-level decoder block 73 is illustrated in more detail in FIG. 8. Decoding is accomplished by means of three shift registers 80A, 80B and 80C. The shift registers are similar to the one shown in FIG. 4 except multiplier 33 is different. In particular, shift registers 80A, 80B and 80C are constructed with $T^{-1}$, $T^{-2}$, and $T^{-3}$ multiplier circuits 90A, 90B and 90C, respectively, which are shown in FIGS. 9A, 9B and 9C, respectively. The three shift registers are initially loaded with syndromes $S_1$, $S_2$ and $S_3$, respectively. They are shifted with each clock cycle. Each shifting operation multiplies the contents of the three shift registers by $T^{-1}$, $T^{-2}$ and $T^{-3}$, respectively, which is done until the contents of the three shift registers become equal.

With continuing reference to FIG. 8, the logic of blocks 81, 82, 83, 84, 85 and 86 perform the function of comparing the contents of the three shift registers. Blocks 81 and 82 are 8 exclusive-OR (Ex-OR) gates each. Blocks 83 and 84, each is an 8-way OR gate and block 85 is a 2-way OR gate Block 86 is a NOT gate. The output of block 86 is a ONE only when the contents of the three shift registers become equal. The number of shifts, thus required, determines x and the final contents of each of the three registers is the error pattern $E_x$ in accordance with Equation (9).

Buffer 93 in FIG. 8 holds the read subblock bytes, $\widetilde{B}_i$, for one subblock, and delivers them one at a time with each clock cycle starting with $\widetilde{B}_0$, in sequence, through $\widetilde{B}_{m+1}$. The correction is performed on-the-fly by block 91 (8 Ex-OR gates) using the error pattern, $E_x$, from shift register 80B through 8-way AND gate 89 which is opened by a signal from NOT gate 86 at $i=x$. The corrected bytes are delivered to buffer 74 (FIG. 7) for immediate or later delivery to system 70.

Subblock-level decoder 73 of FIG. 8 will detect the presence of two errors if Equation (9) is not satisfied for any x. Equation (9) is not satisfied if the syndrome $S_1$ or $S_2$ is not zero and also the contents of the three shift registers 80A, 80B and 80C do not become equal for any clock value from 0 to $m+1$.

Latches 87 and 88 are reset to 0 initially. Latch 88 detects whether $S_1$ or $S_2$ is not zero, and latch 87, with NOT gate 87-1, detects the fact that the contents of the three shift registers have remained unequal. Thus, when the clock count exceeds the value $m+1$ (i.e., the highest byte position), AND gate 92 provides ON signal, UE, indicating an uncorrected error.

It should be noted that the heavy solid signal lines in FIG. 8 indicate parallel data lines for 8-bit parallel processing.

The corrected bytes produced by the decoder of FIG. 8 are delivered in reverse order relative to the order produced by the encoder of FIG. 3. Such reversed order can be eliminated, if necessary, by suitably modifying the decoder circuits. Decoding can also be accomplished by employing other hardware or software methods.

Referring again to FIG. 7, syndromes $S_1$, $S_2$, $S_3$ associated with a subblock are also held in local memory 76 and are retained tor further processing at the block level if that subblock has an uncorrected error as indicated by the UE signal produced by gate 92 of first-level decoder 73. Local memory 76 also retains the identification of an uncorrected subblock as subblock identifier "f". At the end of the block, the second-level check syndrome, $S_0$, from block 75 and the first-level syndromes $S_1$, $S_2$, $S_3$ for subblock f from local memory 76 are processed by second-level decoder 78 to correct two errors in subblock f.

The portion of the subsystem which functions to correct the multibyte error in one subblock by processing four syndrome bytes corresponding to the four check bytes $C_0$, $C_1$, $C_2$ and $C_3$ can be identical to the "on-the-fly" correction subsystem described in U.S.

Pat. No. 4,494,234. The specific details of the logic or the detailed steps involved in correcting a two-byte error in a subblock by processing the four syndrome bytes form no part of the present invention, but are available in the above-referenced patent. Other prior art arrangements for correcting two errors in a word by processing four related syndrome bytes may, of course, be employed.

The last error condition that may occur in the system is where one subblock contains more than two errors and hence, is uncorrectable. This error condition is beyond the capability of the code selected in this embodiment. Hence, it may be miscorrected. Sometimes this will be indicated by second-level decoder 78 when, as a result of processing the block-level syndrome bytes, an uncorrectable error signal is provided since the syndrome processing circuitry of block 78 was unable to identify the location and/or error pattern of one or both errors. The data integrity checks CR1-CR4 will also detect such uncorrected or miscorrected errors.

While the preferred embodiment, as shown and described, assumed the two-level code structure in which a one-byte error in a codeword was correctable at the first level and a two-byte error was correctable at the block level, it should be understood that the method and system may be modified to handle $t_1$ errors at the first codeword level and $t_2$ errors at the block level where $t_1$ is greater than one and $t_2 > t_1$.

It should be recognized in connection with the system just described that in order for the correcting process to work at the second level to correct two errors in the subblock, it is necessary to identify which subblock contained two one-byte errors. In the system described, a subblock is identified by the non-zero subblock syndromes which, when processed by the first-level syndrome processing circuits, indicates an uncorrectable error. If any other subblock provides non-zero syndromes, which causes the first-level syndrome processing circuits to perform a single-error correction, this does not interfere with block-level correction of the one subblock with two errors. However, the block-level decoder of this embodiment cannot correct three errors in one subblock or two errors in two subblocks.

Thus, in the illustrated embodiment, where the block comprises four subblocks, each with two interleaved codewords, the system could correct up to eight one-byte errors by the first-level decoder, provided that each error was in a different codeword. Also, if one or more codewords in one subblock contain two one-byte errors, then, for the system to correct these errors, all codewords in other subblocks in the block must be correctable by the first-level decoder.

In general, $t_1$ is the number of errors correctable at the subblock level and $t_2$ is the number of errors correctable at the block level. The combined capabilities of the two levels can provide correction of various combinations of multibyte errors distributed over many subblocks. This is described in more detail in the following.

As stated earlier in this specification, each subblock consists of m data bytes and $r_1$ check bytes. The subblock comprises a codeword from a code having minimum Hamming distance of $d_1$ symbol positions, where the symbols (i.e., bytes) are elements of Galois Field ($GF(2^b)$). The Hamming distance between two codewords is defined to be the number of symbol positions in which the word symbols differ.

Each block consists of n subblocks and $r_2$ check bytes which are common to all its subblocks. The data part of the block level code can be viewed as one subblock having modulo-2 superposition of n subblock codewords. Then the $r_2$ check bytes (either independently or along with the superpositioned $r_1$ check bytes of all subblocks) provide a minimum Hamming distance of $d_2$ (over one subblock) at the block level, where $d_2 > d_1$.

The decoding process provides correction of up to $t_1$ errors and detection of up to $t_1+c$ errors in each subblock, where $d_1 \geq (2t_1+c+1)$. Unless the number of errors in a subblock exceed the error-correcting capability at that level and such errors are either left uncorrected or are mrscorrected, no further correction at the block level is required. Uncorrected or miscorrected errors at the subblock level are corrected at the block level. If all errors were confined to one subblock, the block level code will provide correction of up to $t_2$ errors, where $d_2 \geq (2t_2+1)$. However, many combinations of errors in other subblocks are also correctable.

The combined error-correction capability of the two-level coding of the present invention further provides correction of any combination of $t_1+x$ errors in any one of the subblocks, and up to $t_1$ errors in any or all of the other subblocks. For this further capability, x represents the number of excess errors in any one subblock and is any positive integer such that $t_1+x \leq t_2$, and $x \leq c$.

Also, when $t_1+x \leq t_2$ and $x > c$, the present invention provides correction of any combination of $t_1+x$ errors in any one of the subblocks and up to $t_1+c-x$ errors in any or all of the other subblocks using the combined, first- and second-level capability. However, in this case, the subblock having $t_1+x$ errors may be miscorrected at the first level, but identified for second-level correction whenever the block-level syndromes are non-zero. The subblock is identified by the fact that it has the highest number of corrections compared to the number of corrections in any other of the subblocks of the codeword. The identified subblock is corrected at the second level in the manner described for the case of a miscorrected subblock in U.S. Pat. No. 4,494,234.

Table I summarizes typical parameters of the present invention, extended to show correction of more errors at the first and second levels. The table shows the capability for correcting up to $t_1=3$ and $t_2=6$ errors.

TABLE 1

| Config | Parameters | | | Error Correction Capability (a,b) | | |
|---|---|---|---|---|---|---|
| | $t_1$ | $t_2$ | c | 1st Level | 2nd Level(*) | 2nd Level(**) |
| I | 1 | 2 | 1 | (1,1) | (2,1) | |
| II | 2 | 3 | 1 | (2,2) | (3,2) | |
| III | 2 | 4 | 1 | (2,2) | (3,2) | (4,1) |
| IV | 3 | 5 | 1 | (3,3) | (4,3) | (5,1) |
| V | 3 | 6 | 1 | (3,3) | (4,3) | (5,2) |
| | | | | | | (6,1) |
| VI | 3 | 6 | 2 | (3,3) | (4,3) | (6,2) |
| | | | | | (5,3) | |

(*) without miscorrection at the first level
(**) with miscorrection at the first level
Error correction capability (a,b) refers to correction of any combination of up to "a" errors in any one of the subblocks, and up to "b" errors in any or all of the remaining subblocks.

It should be noted that, if there are any errors, y, in the block-level check bytes, then the second-level error correction capability, $t_2$, is commensurately reduced by y. Thus, in that event, $t_1+x+y \leq t_2$.

The subblock-level syndromes are decoded by the subblock-level decoder for up to $t_1$ errors in each subblock and the errors are corrected on-the-fly. Thus, when $x=0$, all subblock errors are corrected properly since they are all within the capability of the subblock-level code.

When $x \leq c$, then the subblock-level decoder will detect and identify a subblock having $t_1 + x$ errors without either correcting or miscorrecting such errors. This subblock will be identified by its number f. The errors are then corrected at the second level.

When $x > c$, the subblock-level decoder may miscorrect a subblock having $t_1 + x$ errors by altering at least $(t_1 + c + 1 - x)$ byte positions, since the nearest codeword must differ from the received codeword in at least $(t_1 + c + 1 - x)$ positions for a minimum Hamming distance of $d_1$, where $d_1$ is given by $d_1 = 2t_1 + c + 1$. In contrast, the decoder will alter up to $(t_1 + c - x)$ byte positions in any of the other subblocks, all of which will be corrected properly at the subblock level. The number of alterations in the miscorrected subblock, in such case, exceeds those in any other subblock by at least one. This identifies subblock f having $t_1 + x$ errors uniquely. Alternatively, the decoder may find subblock f uncorrectable apriori and leave it unaltered.

The subblock-level data, after first-level error correction, are used in the computation of the block-level syndrome set, $\{S\}$. The set $\{S\}$ is then the syndrome set for all errors still present in the block, including subblock errors $(t_1 + x)$, block-level check byte errors, y, and up to $t_1$ alterations, if any. The total of $2t_1 + x + y$ is less than the minimum Hamming distance, $d_2$, at the block-level since $t_1 + x + y \leq t_2$ and $d_2$ is given by $d_2 = (2t_2 + 1)$. Thus, the uncorrected errors and alterations will be detected at the block-level by $\{S\} \neq 0$.

Subblock f, with $(t_1 + x)$ errors, is uniquely identified during processing of subblock syndromes from the fact that it was declared uncorrectable or the number of corrections in subblock f exceeds those in any of the other subblocks by at least 1. If all subblocks were corrected properly at the subblock level, then the value of f is of no consequence at the block level.

Let $\{S_f\}$ denote the block level syndromes due to the error patterns (i.e., miscorrections) introduced by the decoder in subblock f. Such error patterns can be removed from subblock f and their contribution $\{S_f\}$ from the syndromes $\{S\}$. Thus, the set $\{S\} \ominus \{S_f\}$ represents the syndromes for the original $(t_1 + x)$ errors in subblock f and y errors in the block level check bytes. The subtraction $\ominus$ is the same as the addition $\oplus$ in modulo 2 arithmetic which is accomplished by the conventional bit-by-bit exclusive-OR logic function. This part of the embodiment is not shown in FIG. 7 and is implemented in the manner described for the case of a miscorrected subblock in U.S. Pat. No. 4,494,234. Note that syndromes $\{S\}$ and $\{S_f\}$ are all known quantities. The block level decoding of $\{S\} \ominus \{S_f\}$ for $t_2$ errors provides proper correction of all remaining errors.

I claim:

1. A multibyte error-correcting system operable to correct up to $t_1$ errors in each subblock of a block of data and $t_2$ errors in said block, where $t_2$ and $t_1$ are positive integers and $t_2 > t_1$, said block having:

(a) at least one subblock, each of which has at least one codeword containing up to $2^b$ b-bit character positions, where b is any positive integer, each codeword consisting of a unique combination of data and $2t_1 + c$ check bytes where c is an integer such that $t_1 \geq c \geq 1$; and (b) up to $2t_2$ b-bit block check bytes, said system comprising:

first syndrome generating means receiving said codeword for generating $2t_1 + c$ syndrome bytes, each containing b bits, corresponding to said $2t_1 + c$ check bytes associated with each codeword, said check bytes corresponding to the modulo 2 sum of bit positions of said codeword selected systematically in accordance with a predetermined partiy check matrix;

first syndrome processing circuitry operable to correct up to $t_1$ errors and detect up to $t_1 + c$ errors in each said codeword by processing said $2t_1 + c$ syndrome bytes;

second syndrome generating means receiving said block of input data for generating up to $2t_2$ block syndrome bytes each contaiing b bits, said block syndrome bytes generated by combining said received block check bytes with block check bytes developed after all said codewords of said block have been received and corrected by said first syndrome processing circuitry, each of said block check bytes corresponding to the modulo 2 sum of bit positions of corrected said codewords that are selected systematically in accordance with said parity check matrix.

2. A multibyte error-correcting system as in claim 1 further including:

logic means receiving said block syndrome bytes from said second syndrome generating means for developing a new set of block syndrome bytes by modifying said original set of block syndrome bytes to reflect a previous miscorrection, if any, of one of said subblocks or omission to correct one of said subblocks; and second syndrome processing circuitry receiving said new set of block syndrome bytes for correcting up to $t_2$ errors in said one subblock that was previously miscorrected or uncorrected.

3. The system recited in claim 1 in which said parity check matrix reflects the roots $\alpha^a$, $\alpha^{a+1}$, $\alpha^{a+2}$, ... $\alpha^{a+d-1}$ of a generator polynomial over a finite field of $2^b$ elements where $\alpha$ is any element of said finite field, and where a is any integer and d is $2t_1 + c$ or $2t_2$.

4. The system recited in claim 2 in which said logic means includes a codeword buffer for storing each codeword as it is read and for storing error data developed by said first syndrome processing circuitry for said codeword as a result of processing said $2t_1 + c$ syndrome bytes.

5. The combination recited in claim 2 in which said logic means operates to identify the subblock which cannot be corrected at the first level.

6. The combination recited in claim 2 in which said logic means operates to identify the subblock requiring the largest number of byte corrections.

7. The combination recited in claim 5 in which said second syndrome processing circuitry corrects up to $t_2$ errors in said identified subblock.

8. The combination recited in claim 6 in which said second syndrome processing circuitry corrects up to $t_2$ errors in said identified subblock.

9. The combination recited in claim 1 in which there is one subblock in each block.

10. The combination recited in claim 1 in which there are a plurality of subblocks in each block.

11. The combination recited in claim 3 in which "b" is 8 and in which the powers $a, a+1, a+2 \ldots$ of the said roots are adjacent integers.

12. The combination recited in claim 11 in which said powers employed for developing said $2t_1+c$ check bytes are a subset of said powers employed to develop said $2t_2$ check bytes.

13. The combination recited in claim 7 in which said system will correct up to $t_1$ errors in each subblock by processing said $2t_1+c$ syndrome bytes in said first processing circuitry and up to $(t_1+x)$ errors in one subblock by processing said $2t_2$ syndrome bytes in said second syndrome processing circuitry where x is a non-negative integer such that $(t_1+x) \leq t_2$ and $x \leq c$.

14. The combination recited in claim 7 in which said system will correct up to $(t_1+c-x)$ errors in each subblock by processing said $2t_1+c$ syndrome bytes in said first processing circuitry and up to $(t_1+x)$ errors in one subblock by processing said $2t_2$ syndrome bytes in said second syndrome processing circuitry, where x is a non-negative integer such that $(t_1+x) \leq t_2$ and $x > c$.

15. A multibyte error correcting method operable to correct up to $t_1$ errors in each subblock of a block of data and $t_2$ errors in said block being read from storage, where $t_2$ and $t_1$ are positive integers and $t_2 > t_1$, said block having:
    (a) at least one subblock, each of which has at least one codeword containing up to $2^b$ b-bit character positions, where b is any positive integer, each codeword including $2t_1+c$ check byte positions; and
    (b) $2t_2$ b-bit block check bytes, said method comprising the following steps:
    generating $2t_1+c$ syndrome bytes, each containing b bits, corresponding to said $2t_1+c$ check bytes associated in said storage with each said codeword, during the reading of each said codeword from said storage, said check bytes corresponding to the modulo 2 sum of bit positions of said one codeword selected systematically in accordance with a predetermined parity check matrix;
    processing said $2t_1+c$ syndromes to correct up to $t_1$ errors and detect up to $t_1+c$ errors in each said codeword;
    generating up to $2t_2$ block syndrome bytes each containing b bits by combining said stored block check bytes after all said codewords of said block have been read and corrected, each said block check byte corresponding to the modulo 2 sum of bit positions of corrected said codewords that are selected systematically in accordance with said parity check matrix.

16. A multibyte error correcting method as in claim 15 further including the steps of:
    developing a new set of block syndrome bytes by modifying the prior set of block syndrome bytes to reflect a previous miscorrection, if any, of one of said subblocks, or omission to correct one of said subblocks, in response to said prior set of block syndrome bytes having a non-zero condition; and
    processing said new set of modified block syndrome bytes for correcting up to $t_2$ errors in said one subblock that was previously miscorrected or uncorrected.

17. The method recited in claim 15 in which said parity check matrix reflects the roots $\alpha^a, \alpha^{a+1}, \alpha^{a+2}, \ldots \alpha^{a+d-1}$ of a generator polynomial where $\alpha$ is any element of said finite field, and where a is any integer and d is $2t_1+c$ or $2t_2$.

18. The method recited in claim 15 in which said step of developing said new set of block syndrome bytes includes storing each codeword in a buffer as it is read and storing error data in said buffer developed by processing said $2t_1+c$ syndrome bytes.

19. The combination recited in claim 18 in which said step of processing said new set of syndrome bytes for correcting up to $t_2$ errors in said one subblock as said block is being transferred from an error-correcting system to a utilization device.

20. The method recited in claim 16 in which said step of developing said new set of block syndrome bytes includes the step of identifying the subblock which cannot be corrected at the first level.

21. The method recited in claim 16 in which said step of developing said new set of block syndrome bytes includes the step of identifying from a plurality of subblocks, each of which had up to $t_1$ errors corrected, the subblock in which the most bytes were corrected.

22. The method recited in claim 20 further including the steps of:
    processing said $2t_1+c$ syndrome bytes to correct up to $t_1$ errors in each subblock; and
    processing said $2t_2$ syndrome bytes to correct up to $t_1+x$ errors in one subblock, where x is a non-negative integer such that $(t_1+x) \leq t_2$ and $x \leq c$.

23. The method recited in claim 20 further including the steps of:
    processing said $2t_1+c$ syndrome bytes to correct up to $t_1+c-x$ errors in each subblock; and
    processing said $2t_2$ syndrome bytes to correct up to $t_1+x$ errors in one subblock, where x is a non-negative integer such that $(t_1+x) \leq t_2$ and $x > c$.

* * * * *